(12) United States Patent
Nodin

(10) Patent No.: US 8,958,234 B2
(45) Date of Patent: Feb. 17, 2015

(54) SELECTOR TYPE ELECTRONIC DEVICE FUNCTIONING BY IONIC CONDUCTION

(75) Inventor: Jean-François Nodin, Quaix en Chartreuse (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 361 days.

(21) Appl. No.: 13/438,509

(22) Filed: Apr. 3, 2012

(65) Prior Publication Data
US 2012/0250395 A1 Oct. 4, 2012

(30) Foreign Application Priority Data

Apr. 4, 2011 (FR) ...................................... 11 52887

(51) Int. Cl.
G11C 11/00 (2006.01)
G11C 13/00 (2006.01)
(52) U.S. Cl.
CPC ........ *G11C 13/0011* (2013.01); *G11C 13/0007* (2013.01)
USPC .............. 365/148; 365/46; 365/163; 365/178
(58) Field of Classification Search
USPC ..................... 365/148, 46, 163, 178, 175, 187
See application file for complete search history.

(56) References Cited

U.S. PATENT DOCUMENTS

| 7,382,647 | B1 * | 6/2008 | Gopalakrishnan | 365/163 |
| 7,974,117 | B2 * | 7/2011 | Tan et al. | 365/148 |
| 8,644,049 | B2 * | 2/2014 | Chung | 365/96 |
| 2005/0286211 | A1 | 12/2005 | Pinnow et al. | |
| 2007/0148882 | A1 | 6/2007 | Dressler et al. | |
| 2008/0023798 | A1 | 1/2008 | Mege | |
| 2011/0084248 | A1 | 4/2011 | Hsieh et al. | |

FOREIGN PATENT DOCUMENTS

WO WO 2010/136056 12/2010

OTHER PUBLICATIONS

Search Report and Written Opinion as issued for French Patent Application No. 1152887, dated Nov. 9, 2011.

* cited by examiner

*Primary Examiner* — Vanthu Nguyen
(74) *Attorney, Agent, or Firm* — Pillsbury Winthrop Shaw Pittman LLP

(57) ABSTRACT

An electronic device includes a first electrode, a second electrode and a solid electrolyte having a base of an ion conducting material. The device remains in the highly resistive state for as long as a first threshold voltage between the first electrode and the second electrode is not reached. The device switches from the state of high resistance to the state of low resistance when the potential difference between the first electrode and the second electrode is equal to or greater than the first threshold voltage. The device switches from the state of low resistance to the state of high resistance when the potential difference between the first electrode and the second electrode equal to or greater than this first threshold voltage is removed and as it decreases it reaches a second positive voltage threshold strictly lower than the first threshold voltage.

9 Claims, 5 Drawing Sheets

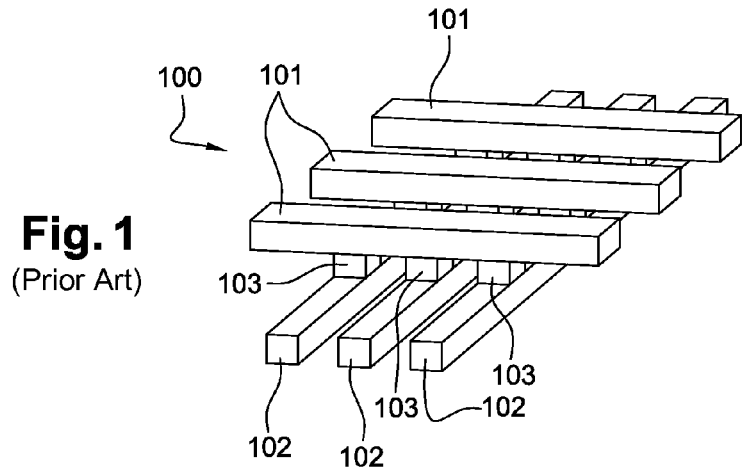
Fig. 1
(Prior Art)
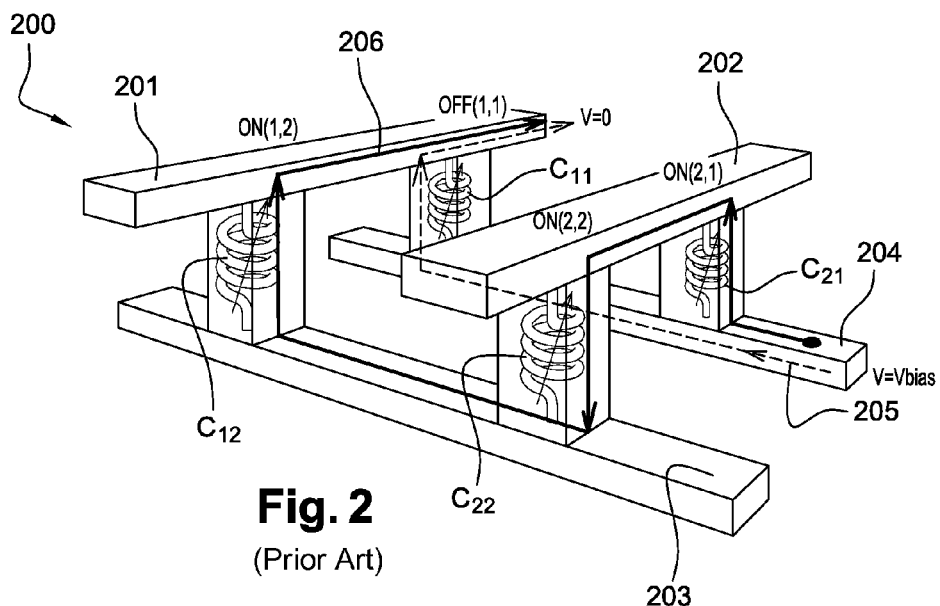
Fig. 2
(Prior Art)
| Resistance (Ω) in 1R | | |
|---|---|---|
| W/L \ B/L | 1 | 2 |
| 1 | 7.9K (ON) | 8.3K (ON) |
| 2 | 3.8K (ON) | 12.7K (ON) |
Fig. 3
(Prior Art)

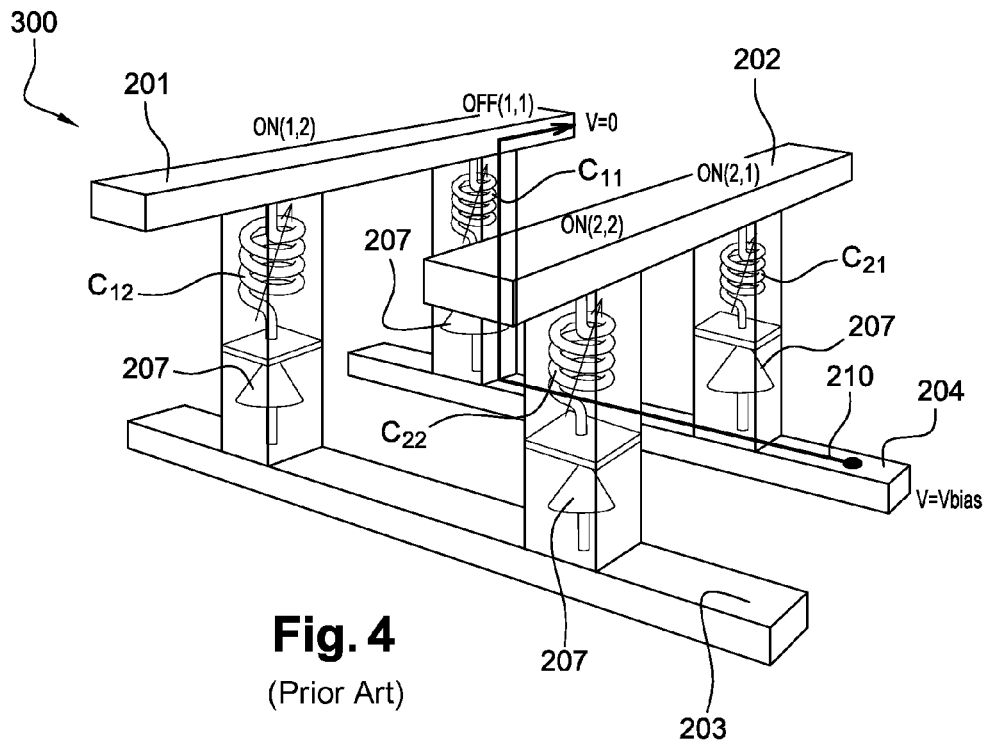
Fig. 4
(Prior Art)
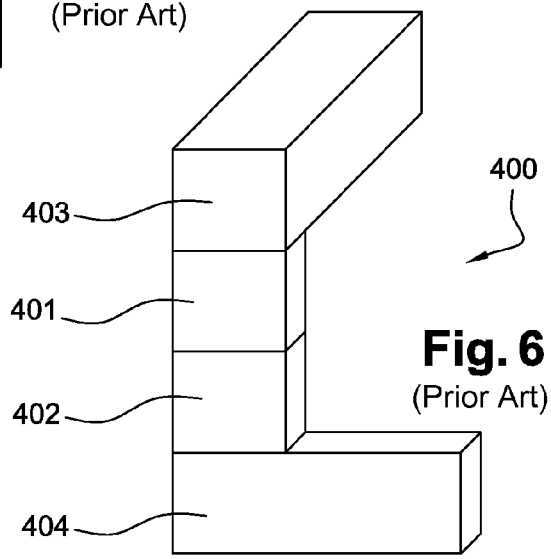
Fig. 5
(Prior Art)
Fig. 6
(Prior Art)

SELECTOR TYPE ELECTRONIC DEVICE FUNCTIONING BY IONIC CONDUCTION

CROSS REFERENCE TO RELATED APPLICATIONS

This application claims priority to French Patent Application No. 1152887, filed Apr. 4, 2011, the entire contents of the application are incorporated herein by reference in its entirety.

FIELD

The present invention relates to a selector type electronic device that functions by ionic conduction; the invention may be applied particularly profitably when used with non-volatile rewritable resistive memories based on active materials.

BACKGROUND

Different types of memories are used depending on the intended applications and desired performances.

Thus, SRAM type memories, or static random access memories offer extremely fast write times, which are needed for calculations by a microprocessor, for example. The major disadvantage of these memories is that they are volatile, and the relatively large size of the memory point means that it is not possible to get a great deal of storage capacity in a reasonable volume.

DRAM type memories, or dynamic random access memories are capable of storing electrical charges in capacities, and offer a large storage capacity. However, the writing times for these memories are slower (several tens of nanoseconds) than for the SRAM type memories and they too are volatile, the information retention time for these memories being in the order of a few tens of milliseconds.

For applications that need the information to be stored even in the event of a power failure, EEPROM or FLASH type non-volatile memories which store electrical charges on the floating gates of field effect transistors are used. However, these memories have drawbacks:
- long writing times (several microseconds),
- limited density because the reduction in size of transistors causes a reduction in the read signal, that is to say the difference between the two states of the memory point, and a shorter information retention period,
- limited number of write cycles because the information retention capacity is reduced together with the write cycles due to the creation of errors in the transistor gate oxide, which enables electrons to escape from the floating gate.

More recently, other types of rewritable non-volatile memories have appeared, based on active materials such as ionic conduction materials (Conductive Bridging RAM (CBRAM) memories), metal oxides (Oxide Resistive RAM (OxRAM) memories), ferroelectric materials (Ferroelectric RAM (FERAM) memories), magnetic materials (Magnetic RAM (MRAM) memories), spin magnetic transfer materials (Spin Torque Transfer RAM (STTRAM) memories), or even phase changing materials (Phase Change RAM (PCRAM) memories). These are all resistive type memories, that is to say they may have at least two states, "OFF" or "ON" corresponding to the transition from a resistive state ("OFF" state) to a less resistive state ("ON" state).

The benefit resistive memories have is that they can be integrated into extremely dense arrays using crossbar type integration (also referred to as "crosspoint" integration):

Such an architecture 100 is shown in FIG. 1 and comprises a plurality of access lines 101 and 102 and a plurality of non-volatile, rewritable type memory cells 103 based on active materials (CBRAM cells for example). The access lines are formed by parallel upper bitlines 101 and lower wordlines 102 perpendicular to the bitlines, elementary cells 103 being sandwiched at the intersections between the bitlines 101 and the wordlines 102. Architecture 100 thus forms a grid in which each memory cell 103 may be addressed individually by selecting the appropriate bitline and wordline.

However, this architecture is associated with certain problems.

For example, the read phase of a cell state is performed by polarisation of the desired row and column; it is then possible to observe a parasitic leakage current passing through the adjacent cells. This phenomenon is illustrated in FIG. 2.

FIG. 2 shows an addressing architecture 200 of a plurality of memory cells (in this case four cells C11, C21, C22 and C12) of the non-volatile, rewritable type and based on active materials (CBRAM cells for example). This matrix 200 comprises two bitlines 201 and 202 and two wordlines 203 and 204 which particularly enable the resistive state of each cell C11, C21, C22 and C12 to be read. In the present case, we will here assume that:
- cell C11 is in the OFF state (strongly resistive state);
- cell C21 is in the ON state (weakly resistive state);
- cell C22 is in the ON state (weakly resistive state);
- cell C12 is in the ON state (weakly resistive state).

In order to read the resistive state of cell C11, wordline 201 and wordline 204 have to be polarised respectively (by applying a potential difference Vbias between these two wordlines).

In theory, the measuring current should only travel in the direction shown by dotted arrow 205.

In practice, because the other three cells are in the ON state, a parasitic leakage current, represented by arrow 206, passes through non-resistive cells C21, C22 and C12. Particularly in the unfavourable situation in which the elements adjacent to the cell to be measured are in the ON state, this leakage current may interfere with the measurement to the point of rendering it impossible to distinguish between the ON and OFF states in the cell to be measured. Thus, FIG. 3 shows a chart indicating the resistance values of the cells C11, C21, C22 and C12. In the present case, a resistance value equal to 7.9 k$\Omega$ will be noted for cell C11, similar to the resistance values of the other three cells, whereas in fact the cell is in the OFF state and therefore has a resistance in the order of M$\Omega$: the measurement is thus completely distorted.

One known solution to this problem consists in adding a p-n junction series diode 207 with each of these cells. Such an architecture is shown in FIG. 4. Identical elements in the figures have the same reference numbers in FIGS. 2 and 4, assuming that cells C11, C21, C22 and C12 in FIG. 4 are in the same resistive states as cells C11, C21, C22 and C12 in FIG. 2.

In this case, since diodes 105 are unipolar, they block the passage of the parasitic current, and thus only allow the current represented by arrow 210, which is induced by the polarisation of bitline 201 and wordline 204 (application of a potential difference Vbias between these two lines).

Accordingly, FIG. 5 shows a chart indicating the resistance values of the individual cells C11, C21, C22 and C12. In the case of the architecture of FIG. 4, this shows resistance values that are consistent with reality, with cell C11 having a resistance equal to 4.2 M$\Omega$ (being OFF) compared with the resistance values of the other three cells, which are in the order of a few tens of k$\Omega$: this measurement is therefore correct.

However, the architecture as it is shown in FIG. 4 also presents certain problems particularly with regard to the fact that the diodes have current densities that are still limited in passing mode.

Accordingly, for a given silicon surface it is not currently possible to create a diode having the same surface as the memory cell as well as an adequate passing current $I_{on}$ (current density of the diodes too low) and a relatively low leakage current $I_{off}$ at the same time. This situation presents serious difficulties particularly when a series diode is used with a phase changing type cell PCRAM, which requires large switching currents.

One known solution to this problem consists in using low temperature diodes, which have moderately satisfactory average characteristics in terms of current density ($10^5$ to $10^8$ A/cm$^3$). However, the use of these low temperature diodes presents a serious problem for multilayer crossbar integrations (several layers of series diodes with superposed resistive memory cells in order to increase integration density; in other words, several architectures 300 such as those shown in FIG. 4 are superposed). In fact, in order to manufacture a low temperature diode an activation annealing process must be carried out at high temperature (typically 1100° C.). Such annealing temperatures are not compatible with resistive memories on a chalcogenide base (PCRAM and CBRAM), which do not respond well to manufacturing temperatures in excess of 450° C.

An alternative to using series diodes with the memory cell consists in using an architecture 400 (see FIG. 6) that comprises a series electrolytic cell 401 having a resistive cell memory 402, the two cells being located between a bitline 403 and a wordline 404; an example of such a configuration is described in the document U.S. Pat. No. 7,382,647. The benefit of such a salutation is that it enables relatively high current densities in passing mode.

The function of electrolytic cell 401 is similar to that of a CBRAM type device and it is based on the formation of metallic elements called "dendrites" inside the solid electrolyte between two electrodes when these electrodes are raised to appropriate potentials for each. The formation of these dendrites makes it possible to obtain a given electrical conductivity between the two electrodes. By modifying the potentials applied respectively to each electrode, it is possible to modify the distribution and number of dendrites, and thus also to modify the electrical conductivity between the two electrodes. For example, by inverting the potential between the electrodes it is possible to eliminate or reduce the dendrites, and so to prevent or considerably limit the electrical conductivity that is created by the presence of the dendrites. Solid electrolyte devices may thus have a two-state function: an "ON" state and an "OFF" state, and may perform the role of selector for example.

For exemplary purposes, FIG. 7 shows a simplified diagram of an electronic device 10 of the CBRAM type. This device 10 comprises a solid electrolyte 14, having for example a base of doped chalcogenide such as GeSe, arranged between a lower, nickel electrode 12, which serves as an inert cathode, and a portion of ionisable metal 16 having a silver base, that is to say a portion of a metal that readily forms metal ions (in this case silver ions $Ag^+$), serving as the anode. An upper electrode 18 is arranged on the portion of ionisable metal 16. These elements are insulated electrically by lateral dielectric portions having an $SiO_2$ or SiN base, arranged around these elements.

The state of a CBRAM memory device is produced by the difference in electrical resistivity between two states: ON and Off. In the OFF state, the metal ions (in this case $Ag^+$ ions) yielded by the portion of ionisable metal 16 are dispersed throughout solid electrolyte 14. In this way, no electrical contact is made between the anode and the cathode, that is to say between the portion of ionisable metal 16 and lower electrode 12. Solid electrolyte 14 forms a highly resistive electrically insulating zone between anode 16 and cathode 12. A write operation in memory device 10 is performed by applying a potential difference between anode 16 and cathode 12. The $Ag^+$ metal ions that are initially dispersed in solid electrolyte 14 then migrate towards cathode 12 to form a metal deposit. This metal deposit takes the form of metal nanofils, called "dendrites", which grow progressively inside the electrolytic medium under the effect of the applied voltage and eventually creating bridges of electrical conductivity between anode 16 and cathode 12: this is the ON state. Solid electrolyte 14 then forms an electrically conductive zone due to the metal nanofils formed between anode 16 and cathode 12. A deletion operation is carried out by applying a potential difference with the opposite sign between electrodes 12 and 18, thereby causing the metal deposit (the nanofils) formed previously to "dissolve" into their ionic form in solid electrolyte 14, and enabling device 10 to return to the OFF state.

The use of a solid electrolyte type device as a series selector with the memory cell (instead of a p-n diode) also presents a number of difficulties. This mode of operation effectively requires controlled switching of the selector device that is independent of the read/write function of the memory cell. As a result, guiding the assembly is quite complex. Among other things, it necessitates switching of the selector to enable the resistive memory to be accessed or isolated.

SUMMARY

Against this background, aspects of the present invention aim to provide an electronic device that is capable of being used as a series selector with a resistive memory type elementary cell, having a passing mode current sufficient to enable its use with the resistive cells based on active materials, particularly PCRAM type cells, compatible with "crossbar" multilayer integration and not requiring independent guidance for enabling the resistive memory cell to be accessed or isolated.

To this end, an aspect of the invention provides an electronic device comprising:
- a first electrode;
- a second electrode;
- a solid electrolyte having a base of an ion conducting material, the first and second electrodes being arranged on opposite sides of this electrolyte, and the first and second electrodes being configured to form at least one metal dendrite between the first electrode and the second electrode from metal ions circulating in this electrolyte when a potential difference equal to or greater than a first positive threshold voltage is applied between this first and this second electrode;
- the device having two resistive states:
- a state of high resistance, called strongly resistive;
- a state of low resistance, called weakly resistive;
- wherein the concentration of the metal that forms the metal ions in the electrolyte is chosen so that:
- the device remains in state of high resistance for as long as the first threshold voltage between the first electrode and the second electrode is not reached;
- the device switches from the state of high resistance to the state of low resistance when the potential difference between the first electrode and the second electrode is equal to or greater than this first threshold voltage;

the device switches from the state of low resistance to the state of high resistance when the potential difference between the first electrode and the second electrode equal to or greater than this first threshold voltage is removed and as it decreases reaches a second positive voltage threshold strictly lower than the first threshold voltage.

The term dendrite is used to refer to at least one metal nanofil formed by the growth of metal ions inside the electrolyte.

The applicant was very surprised to discover that the resistive behaviour of a solid electrolyte having a base of an ion conducting material could be modified substantially with regard to the classic behaviour of the CBRAM cells known from the related art if the metal forming the metal ions is used in an appropriate concentration in the electrolyte.

The device according to an embodiment of the invention has two resistive states: a first, OFF state is strongly resistive in both negative and positive polarities if the potential difference between the first electrode and the second electrode is below a first positive voltage threshold Vthon (corresponding for example to a resistance Roff greater than $10^8$ MΩ).

If a voltage equal to or greater than Vthon is applied, the device according to an embodiment of the invention switches to an ON state with low resistance (for example a resistance Ron in the range from 10Ω to 1 kΩ).

When a voltage equal to or greater than Vthon is no longer applied, the potential difference between the first and second electrodes falls spontaneously from Vthon (or from a voltage greater than Vthon); as soon as the potential difference between the first and second electrodes reaches a second positive voltage threshold Vthoff, the device according to an embodiment of the invention switches from the second, weakly resistive ON state to the first, strongly resistive OFF state. The return from the low impedance state to the high impedance state takes place automatically when the voltage falls below the positive threshold voltage Vthoff. This behaviour of the device according to an embodiment of the invention is fundamentally different from the behaviour of a standard CBRAM cell with an effect memory, which requires the application of a negative voltage to return to the high impedance OFF state. According to an embodiment of the invention, when the potential difference between the first and second electrodes falls naturally from the first positive threshold voltage Vthon to the second positive threshold voltage Vthoff, the switch from the ON state to the OFF state also takes place automatically, without the need to control the device using a negative potential difference between the first and second electrodes.

Like a standard CBRAM device, the device of an embodiment of the present invention also functions with a solid electrolyte, but in a different manner due to the precise control of the quantity of soluble ions present in the electrolyte. Therefore, it is interesting to note that, in contrast to the classic CBRAM cells, the mode of operation of the device according to an embodiment the invention is not particularly adapted to a function as a non-volatile rewritable memory cell given that the switch from the ON state to the OFF state takes place automatically, without control of the potential difference between the electrodes.

On the other hand, the device according to an embodiment of the invention may beneficially be used as a series selector with a resistive type memory cell, the two series elements being arranged between two access lines (bitline and wordline). Unlike a series resistive memory cell with a standard CBRAM device used as a selector, such an arrangement does not necessitate independent guidance of the selector, so the guidance electronics may be made simpler.

The device according to an embodiment of the invention may also be developed at low temperature (typically a temperature below 250° C.) and is therefore entirely compatible with multilayer "crossbar" integration with chalcogenide type materials that cannot withstand excessively high temperatures.

The device according to an embodiment of the invention may also have one or more of the features set forth below, either alone or in any technically possible combination thereof:
  the concentration of metal that forms the metal ions in the electrolyte is lower than the saturation concentration of this metal in the material that constitutes the electrolyte;
  the device according to an embodiment of the invention includes a section of ionisable metal interposed between the first electrode and the electrolyte;
  the metal ions circulating in the electrolyte are $Ag^{2+}$, $Zn^{2+}$ or $Cu^{2+}$ ions;
  the solid electrolyte is produced from a chalcogenide material such as a selenide or a telluride certain oxides such as $HfO_2$, $Ta_2O_5$, $TiO_2$, GdOx, CuOx, WOx, or sulphides such as $GeS_x$, $Cu_xS$ or AgS.

A further aspect of the present invention is an elementary cell that comprises a device according to an embodiment of the invention mounted in series with a memory cell that is capable of assuming at least two states of resistivity corresponding to two memory states.

The elementary cell according to an embodiment of the invention may also have one or more of the features set forth below, either alone or in any technically possible combination thereof:
  the memory cell is a rewritable, non-volatile memory cell such as an OxRAM, CBRAM, MRAM, PCRAM, FeRAM or STTRAM memory;
  the elementary cell comprises two devices according to an embodiment of the invention, mounted in parallel head to tail, the assembly of these two parallel devices being mounted in series with the memory cell.

A further aspect of the present invention is an addressing matrix for a plurality of elementary cells, that comprises:
  a plurality of elementary cells according to an embodiment of the invention;
  two levels of command lines:
    a first level including a plurality of bitlines parallel with each other;
    a second level including a plurality of wordlines parallel with each other;
    each of these cells being arranged at the intersection between a wordline and a bitline.

BRIEF DESCRIPTION OF THE DRAWINGS

Other characteristics and benefits of embodiments of the invention will be apparent from the description thereof in the following, which is provided for purely exemplary and entirely non-limiting purposes, with reference to the accompanying drawing, in which:

FIG. 1 is a schematic representation of a "crossbar" type architecture;

FIG. 2 shows a first addressing architecture for a plurality of memory cells according to the related art;

FIG. 3 is a table showing the resistance values of the various cells in the architecture of FIG. 2;

FIG. 4 shows a second addressing architecture for a plurality of memory cells according to the related art;

FIG. 5 is a table showing the resistance values of the various cells in the architecture of FIG. 4;

FIG. 6 shows a third addressing architecture for a plurality of memory cells according to the related art;

Common elements are identified with the same reference numbers in all figures.

DETAILED DESCRIPTION

FIGS. 1 to 7 have already been described with reference to the related art.

Figure 7:
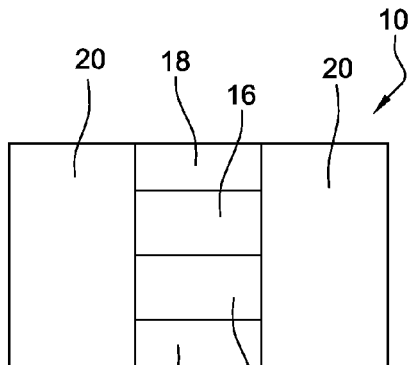
FIG. 7 is a schematic representation of a CBRAM type ionic conduction device according to the related art.
Figure 8:
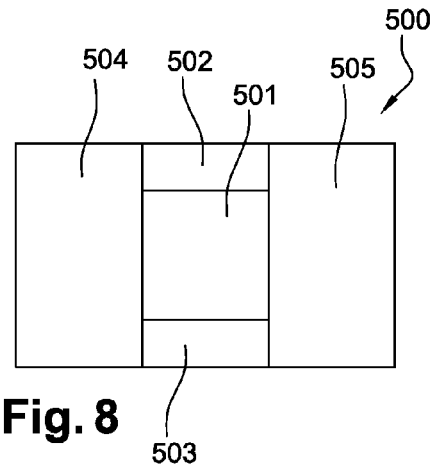
FIG. 8 is a schematic representation of a first embodiment of a device according to the invention.

FIG. 8 is a schematic representation of an electronic ionic conduction device 500 according to a first embodiment of the invention.

Electronic device 500 comprises:
a solid electrolyte 501;
a first conductive electrode 502;
a second conductive electrode 503;
first and second electrically insulating zones 504 and 505.

Solid electrolyte 501 may be produced from a chalcogenide material such as a selenide (GeSe) or a telluride, from certain oxides such as $SiO_2$, $HfO_2$, $Ta_2O_5$, $TiO_2$, GdOx, CuOx, WOx, or sulphides such as $GeS_x$, $Cu_xS$ or AgS.

The solid electrolyte is arranged between first electrode 502 (upper electrode in contact with the upper surface of the electrolyte) and second electrode 503 (lower electrode in contact with the lower surface of the electrolyte).

First electrode (upper electrode) 502 is produced for example from an inert metal material such as Ni or W, and forms an anode.

Second electrode (lower electrode) 503 is produced for example from an inert metal material such as Ni or W, and forms a cathode.

The stack formed by first electrode 502, electrolyte 501 and second electrode 503 is electrically insulated by dielectric lateral sections 504 and 505, which have a base of $SiO_2$ or SiN, for example, and are arranged around the stack.

Metal ions (for example $Ag^{2+}$, $Zn^{2+}$ or $Cu^{2+}$ ions) are diffused in solid electrolyte 501. This diffusion in solid electrolyte 501 may be obtained for example during production of device 500 by using a portion (referred to interchangeably in the following text as "soluble electrode") of soluble ionisable metal (for example Ag, Zn or Cu) on top of electrolyte 501. When this portion of ionisable metal is deposited, the metal ions given off by the portion are dispersed in solid electrolyte 501. This diffusion may be spontaneous (spontaneous diffusion is said to occur if the metal diffused into the electrolyte when it is deposited, with no special treatment) or non-spontaneous (in this case, diffusion is stimulated by treatment such as a thermal treatment or UV stimulation). By way of example, the document "Local structure resulting from photo and thermal diffusion of Ag in Ge—Se thin films" (M. Mitkova*, N. N. Kozicki, H. C. Kim, T. L. Alford, Center for Solid State Electronics Research, Arizona State University, USA) describes a method for obtaining a 35 nm thick film of $Ge_{20}Se_{80}$ deposited by thermal vapour deposition, with a 20 nm film of silver being evaporated onto the GeSe afterwards: in this case the diffusion of the Ag is not spontaneous here and may be initiated either by thermal diffusion or by optical diffusion. Thermal diffusion is performed by exposing the sample to a temperature of 200° C. Optical diffusion is obtained by exposing the sample to a light source having a power of 6.5 mW/cm$^2$ for a wavelength of 436 nm.

Conversely, spontaneous diffusion may be obtained by depositing a film of Ag onto a film of GeSe using low power magnetron cathodic pulverisation: if operating conditions are chosen ad hoc, the Ag diffuses spontaneously and homogeneously throughout the GeSe volume.

Once the target concentration of the metal that forms the metal ions has been obtained, the upper electrode 502 forming is deposited to form the anode.

Figure 9:
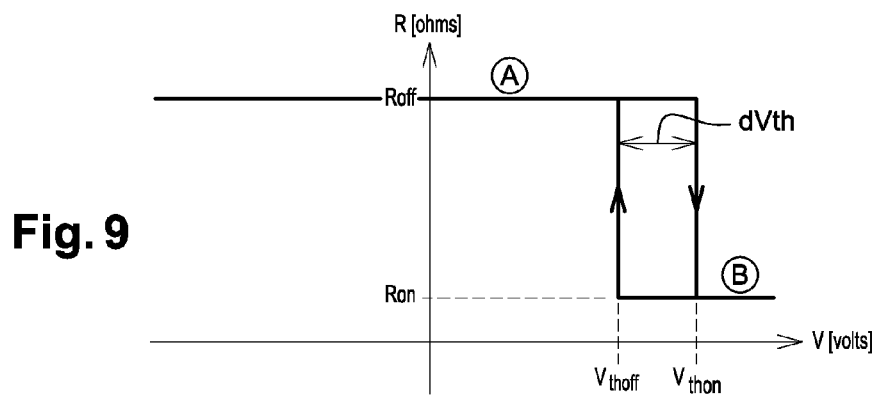
FIG. 9 shows the progression of resistance in the device of FIG. 8 as a function of the potential difference applied between the electrodes in the device.

According to an embodiment of the invention, the concentration of metal that forms the metal ions in the electrolyte is selected to obtain the voltage resistance as illustrated in FIG. 9, which plots the course of resistance R (in Ohm) of device 500 against the potential difference V (in Volt) between first electrode 502 and second electrode 503.

It should be noted that device 500 has two resistive states:
a high impedance stable state (A) (with a resistance Roff>$10^8$ Ohm);
a low impedance state (B) (with a resistance 10 Ohm<Ron<$10^3$ Ohm) which is initiated when the voltage exceeds a first positive voltage threshold Vthon.

With a potential difference V greater than first voltage threshold Vthon, device 500 switches to the low resistance state B. In other words, when a positive potential difference equal to or greater than Vthon is applied between the first and second electrodes, the state switches from high resistance A to low resistance B. The $Ag^{2+}$ or $Cu^{2+}$ metal ions that were initially dispersed throughout solid electrolyte 501 migrate towards second electrode 503 to form a metal deposit. This metal deposit takes the form of metal nanofils, called "dendrites", which grow progressively inside the electrolytic medium under the effect of the Vthon voltage applied and eventually create electrical conductivity bridges between first and second electrodes 502 and 501.

When a positive potential difference equal to or greater than Vthon between the first and second electrodes is no longer applied, voltage V between the first and second electrodes falls spontaneously and finally reaches a second positive voltage threshold Vthoff; when this second positive voltage threshold Vthoff is reached, device 500 switches back from the weakly resistant state B (ON) to strongly resistant state A (OFF).

This return from the low impedance state to the high impedance state takes place automatically when the potential difference between the first and second electrodes 502 and 503 amounts to a voltage equal to or less than second voltage threshold Vthoff; it should be noted that this behaviour differs from that of a classic CBRAM cell with memory effect, which requires the application of a negative voltage before it returns to the high impedance OFF state. It should also be noted that device 500 remains in the high impedance state in the negative polarity (that is to say with a negative potential difference between the first and second electrodes).

The hysteresis between first positive voltage threshold Vthon and the second positive voltage threshold is represented as dVth.

The characteristic type shown in FIG. 9 is preferably observed when the concentration of active metal that forms the metal ions in the electrolyte is lower than the saturation concentration. Setting this concentration lower than the saturation concentration makes it possible to obtain a second threshold voltage Vthoff marking the return to positive OFF. The saturation point is understood to be the point at which it is not possible to diffuse any more active metal in the electrolyte, as the metal then forms clusters on the electrolyte surface. Having a concentration lower than saturation makes it possible to obtain a different behaviour from that of a classic CBRAM cell, which needs a negative voltage in order to return to the high impedance OFF state: according to an embodiment of the invention, the end of the application of the Vthon voltage causes the one or more dendrites to break up and the ions to be redissolved in the electrolyte spontaneously when the potential difference reaches Vthoff, without the need to apply a negative voltage.

The fact that the concentration is below the saturation level means that in the event of spontaneous diffusion the fraction of soluble metal used to create ions in the electrolyte must of necessity disappear completely. Likewise, if the material of upper electrode 502 and/or lower electrode 503 is spontaneously soluble in soluble electrolyte 501 (this is typically the case for an electrode made of copper or silver), a diffusion barrier must be deposited (between first electrode 502 and electrolyte 501 and/or between electrolyte 501 and second electrode 503 respectively).

Figure 10:
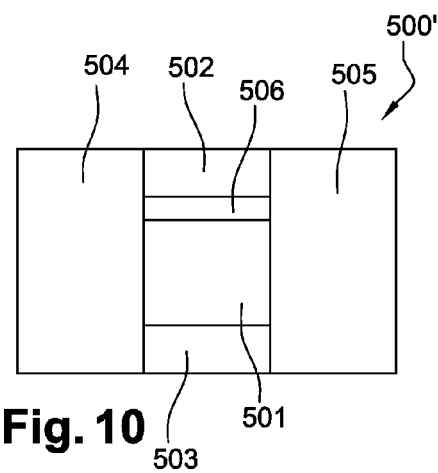
FIG. 10 is a schematic representation of a second embodiment of a device according to the invention.

If diffusion is stimulated, the situation may be different and it is possible to modify the duration and stimulation conditions in order to preserve a part of the soluble metal portion between first electrode 502 and electrolyte 503 and still keep the concentration of the metal in the electrolyte below the saturation point. Such a device 500' is shown in FIG. 10; device 500' is almost identical to device 500, the only difference being that includes a layer 506 of soluble metal (typically Ag or Cu) in the electrolyte, but which has stopped dissolving before the saturation point is reached. The other features shared by both devices 500 and 500' bear the same references. Layer 506 is arranged between upper electrode 502 and electrolyte 501.

A structure such as that of device 500 may also be achieved when diffusion is stimulated if the duration and conditions of stimulation are adapted so that the entirety of the soluble metal layer is diffused in electrolyte 501 but without reaching saturation concentration.

Figure 11:
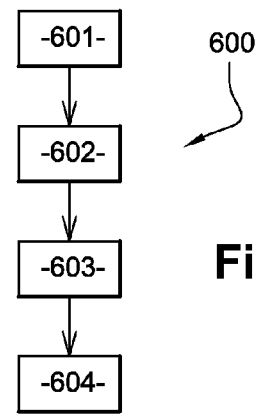
FIG. 11 illustrates the main steps in the process of manufacturing a device according to an embodiment of the invention such as the device of FIG. 8 or 10.

Whatever the embodiment variant (FIG. 8 or FIG. 10), FIG. 11 shows the main steps in the manufacturing process 600 for a device according to an embodiment of the invention.

First step 601 consists in creating second electrode 503 that forms the lower electrode. This lower electrode 503 (second electrode) is made from a conductive material (W or Ni for example) and is deposited using methods known in microelectronics (pulverisation, CVD, and the like). The typical thickness of this second electrode 503 is in the range between 100 nm and 300 nm. Second electrode 503 may be scribed to lend it the desired dimensions and shape. As will be seen in the following, if the device according to an embodiment of the invention is used in conjunction with a resistive type memory cell, the cross section of second electrode 503 must also be compatible with the constraints associated with the manufacture of the memory cell (temperature and the like).

According to step 602, solid electrolyte 501 is then deposited. The thickness of the electrolyte will be calculated on the basis of the type of electrolyte chosen, the desired resistance in the OFF state (OFF resistance is proportional to the thickness of the material according to the law $R=\sigma \cdot e/S$, where e is the thickness of the material, $\sigma$ is the resistivity of the material and S is the surface area), the geometry of the device (surface area S), the breakdown voltage of the material (the electrical breakdown field must be higher than the device's switching voltage), and other criteria. The electrolyte will typically have thickness in the order of 10 nm to 100 nm.

According to step 603, the soluble electrode portion (completely diffused in the example of FIG. 8 and indicated by reference number 506 in FIG. 10), which is typically Ag or Cu, is deposited on solid electrolyte 501. The thickness of the soluble electrode is determined by the electrode material, the type of dissolution on the electrolyte (spontaneous diffusion, diffusion stimulated thermally or by UV treatment), the desired switching voltage Vthon, and the thickness of solid electrolyte 501. At all events, the concentration of the metal element of the electrode that is soluble in solid electrolyte 501 must be adjusted to obtain the desired switching voltage Vthon and it is less than the saturation level in order to guarantee a spontaneous return to the OFF state. The optimum concentration is determined experimentally by varying the deposition thickness of the soluble electrode 501 in the case of spontaneous diffusion and/or varying the stimulation conditions in the case of stimulated diffusion. The process for optimising the concentration will be discussed in greater detail with reference to FIG. 12.

Step 604 consists in creating first electrode 502, the upper electrode. This upper electrode 502 is made from a conductive material (typically W or Ni) and is deposited using methods known in microelectronics (pulverisation, CVD, and the like). The typical thickness of this first electrode 502 is in the range between 100 nm and 300 nm. As with second electrode 503, this first electrode 502 may be scribed to lend it the desired dimensions and shape.

The surface area of the active zone is defined either the surface areas of the first and second electrodes 502 and/or 503, or by the surface area of solid electrolyte 501. This surface area is typically in the range between 30 $nm^2$ and 300 $nm^2$.

Figure 12:
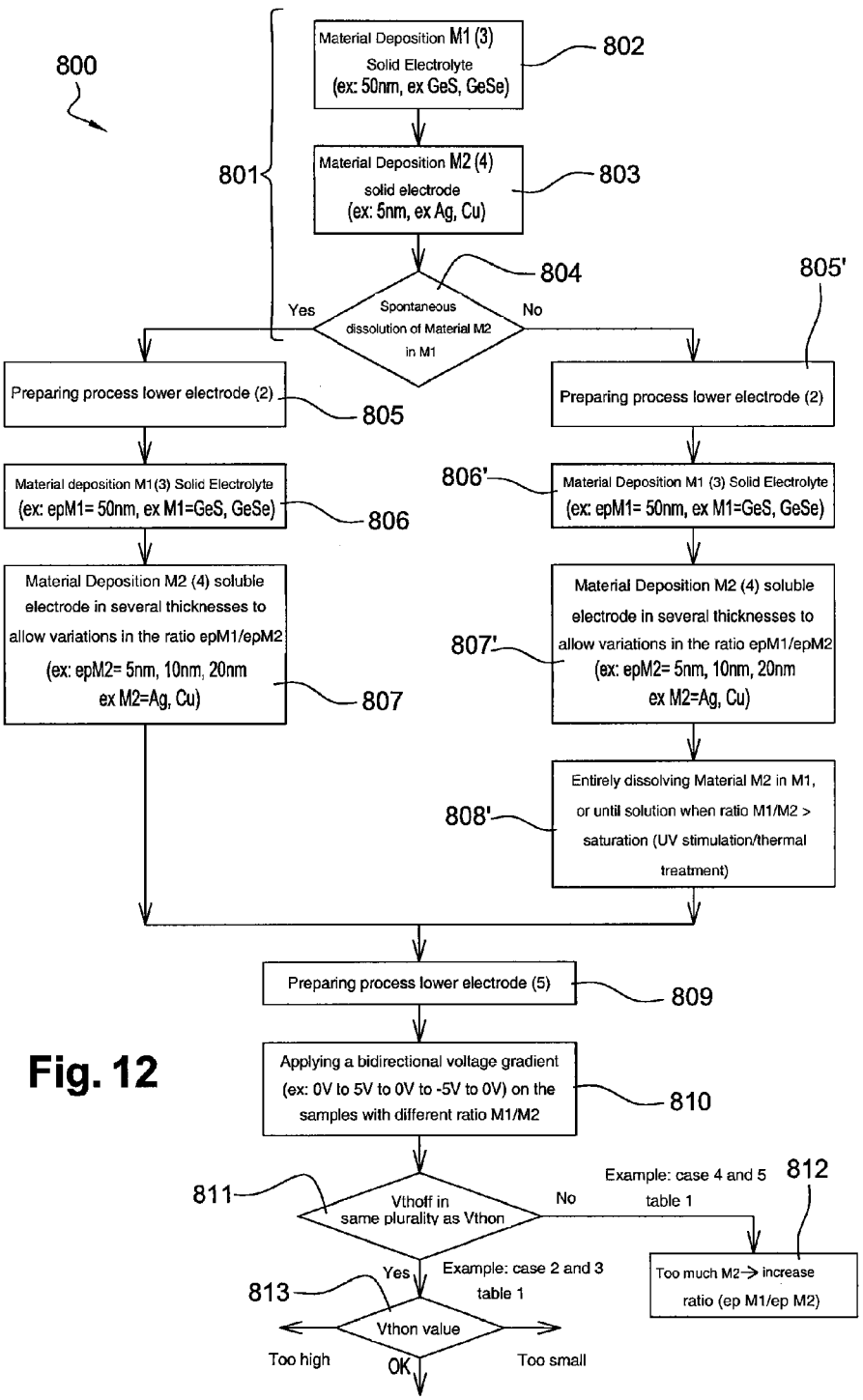
FIG. 12 illustrates the iterative method by which a ratio may be determined between the thickness of the electrolyte and the thickness of the soluble metal layer in order to obtain a voltage suitable for the device according to an embodiment of the invention.

FIG. 12 shows the various steps of in iterative method 800 by which the ratio between the thickness of the electrolyte and the thickness of the soluble metal layer is calculated in order to obtain a first threshold voltage Vthon.

This method 800 is an experimental method with which the thicknesses of the electrolyte and the soluble metal layer may be determined ad hoc to obtain a characteristic such as is shown in FIG. 9 with given first and second threshold voltages Vthon and Vthoff.

The first part 801 of method 800 consists in determining the dissolution type, whether spontaneous or not, of the soluble electrode in the electrolyte.

According to a step 802, a solid electrolyte M1 having thickness epM1 is deposited.

According to a step 803, a soluble metal electrode layer M2 having thickness epM2 is deposited.

According to a step 804, as determination is made as to whether or not the soluble metal electrode of M2 will dissolve spontaneously. Spontaneous diffusion of the soluble electrode of M2 occurs if all or part of the material M2 diffuses into solid electrolyte M1 when M2 is deposited. The determination as to whether dissolution is spontaneous or not may be made for example by observation or by measuring the composition of M1, the presence of M2 in M1, measuring the thickness of M2 (for example no more M2 on the surface of M1) or increase thickness of M1, and so on.

The presence of M2 in M1 may be verified for example by X-ray spectroscopy or by "secondary ion mass spectroscopy" (SIMS) measurement. Thickness measurements or detection of a reduction in thickness may be obtained for example by X-ray spectroscopy or with epsilometer measurements.

Then, a complete stack is made taking into account whether diffusion is spontaneous or not.

For spontaneous diffusion:
  according to step 805, a lower electrode is prepared;
  according to step 806, material M1 is deposited to form the solid electrolyte having thickness epM1;
  according to step 807, material M2 of the soluble electrode is deposited in several thicknesses epM2 to allow variations in the ratio epM1/epM2.

For non-spontaneous diffusion:
  according to step 805', a lower electrode is prepared;
  according to step 806', material M1 is deposited to form the solid electrolyte having thickness epM1;
  according to step 807', material M2 of the soluble electrode is deposited in several thicknesses epM2 to allow variations in the ratio epM1/epM2;
  according to step 808', diffusion is stimulated.

According to step 809, which is carried out whether diffusion is spontaneous or not, the upper electrode is prepared.

Thus, several samples have been prepared with the same electrolyte thickness epM1 and various thicknesses epM2 of the soluble electrode (and accordingly different epM1/epM2 ratios). Electrical tests on these samples will enable ad hoc determination of the epM1/epM2 ratio.

According to step 810, for example a bidirectional voltage gradient is applied between the upper electrode and the lower electrode (for example from 0V to 5V, from 5V to 0V and from 0V to −5V) on the samples with different epM1/epM2 ratios.

According to step 811, the progress of resistance R is plotted against potential difference V between the upper electrode and the lower electrode.

Figure 13:
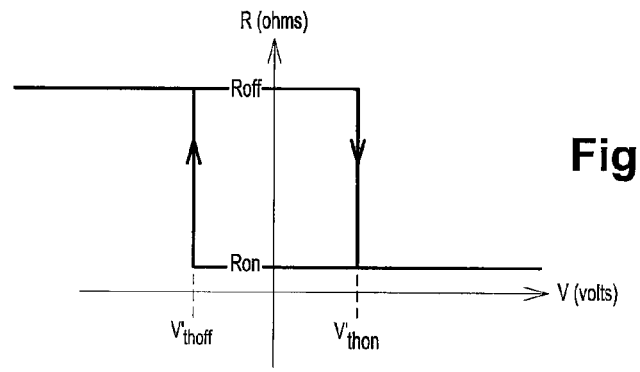
FIG. 13 shows the progression of resistance in a known CBRAM type cell as a function of the potential difference applied between the electrodes in the cell.

Two scenarios are possible:
  either an R(V) characteristic curve will be observed such as is shown in FIG. 13, which is a standard characteristic curve for a CBRAM type cell with two stable states that requires two threshold voltages with different signs (in this case Vthoff negative in order to switch from the ON state to the OFF state and Vthon positive in order to switch from the OFF state to the ON state);
  or a characteristic curve of a device according to an embodiment of the invention as represented in FIG. 9 will be observed.

Thus it is verified whether Vthoff and Vthon are positive voltages (step 811).

If Vthoff is negative and Vthon is positive, the epM1/epM2 ratio will be too small and it will be necessary to increase this ratio (step 812), for example by reducing thickness epM2. An epM1/epM2 ratio that is too small corresponding to a negative Vthoff voltage and positive Vthon voltage indicates that the concentration of metal that forms the metal ions in the electrolyte is at the saturation point.

On the other hand, if the R(V) characteristic curve conforms to the curve in FIG. 9 (Vthoff and Vthon both positive), the concentration of metal that forms the metal ions in the electrolyte is below the saturation level and the device will function according to an embodiment of the invention. In this case, it is also possible (step 813) to reduce the epM1/epM2 ratio and still remain below the saturation level so as to obtain a lower value for the first threshold voltage Vthon. It is also possible to increase the epM1/epM2 ratio further so as to obtain a higher value for the first threshold voltage Vthon. One has to note that it is further possible to obtain an R(V) characteristic curve such as shown in FIG. 13 even with a concentration of metal that forms the metal ions in the electrolyte is below the saturation level: in that case, said concentration of metal that forms the metal ions in the electrolyte should be more lowered.

The difference between the first and second threshold voltages may be adjusted using the electrolyte material.

In the following, three examples involving spontaneous diffusion of Ag in $Ge_{25}Se_{75}$ deposited by pulverisation are presented.

With an epM1/epM2 ratio=5.55, the following values: Vthon=+4.24 V and Vthoff=+1.53 V. The R(V) characteristic curve thus conforms to FIG. 9 (Vthoff and Vthon positive). The concentration of metal forming the metal ions in the electrolyte is below the saturation level and the device functions in accordance with an embodiment of the invention.

A value for first threshold voltage Vthon lower than +4.24 V may be obtained while still remaining below the saturation level by reducing the epM1/epM2 ratio. Thus in the case of am epM1/epM2 ratio=3.03 V, the following values are obtained: Vthon=+3.03 V and Vthoff=+0.61 V.

The epM2/epM1 ratio will preferably be in a range between 0.09 and 0.33 (equivalent to an epM1/epM2 ratio in the range from 3.03 to 11.11) for the purposes of obtaining a device that functions in accordance with an embodiment of the invention.

The device 500 or 500' according to an embodiment of the invention as shown in FIG. 8 or 10 may be used to particular benefit when it is connected in series with an elementary memory cell that is capable of assuming at least two resistive states corresponding to two memory states and integrated in a "crossbar" type addressing matrix.

Figure 14:
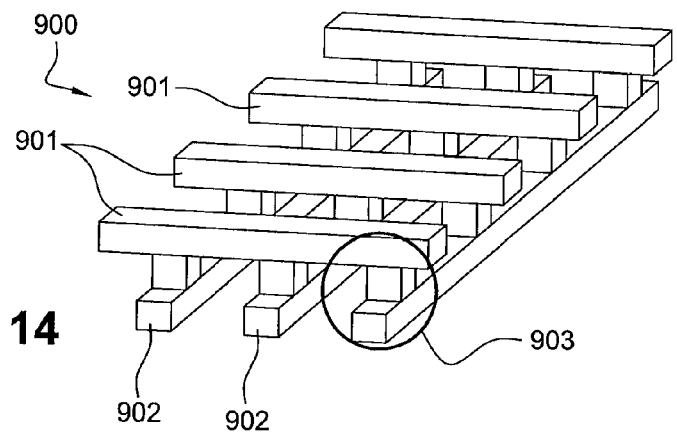
FIG. 14 is a schematic representation of an addressing matrix integrating a plurality of devices according to an embodiment of the invention.

Such an addressing matrix 900 is shown in FIG. 14.

Matrix 900 comprises a plurality of parallel upper bitlines 901 and of lower wordlines 902 perpendicular to the bitlines, elementary cells being sandwiched between bitlines 901 and wordlines 902. In this case, each elementary cell 903 (see FIG. 15) comprises for example and memory cell 904 in series with a device according to an embodiment of the invention 905, said device 905 according to an embodiment of the invention functioning as a selector of the current passing through memory cell 904 according to the voltage applied between the bitline and the wordline.

Thus, an elementary cell 903 is located at each intersection of a bitline and a wordline and sandwiched between the two lines. Accordingly, if one wishes to read or write a binary value in memory cell 904, one polarises the corresponding bitline and wordline so as to switch device 905 to the ON state. It will return to the OFF state spontaneously as soon as the read or write operation is completed. Device 905 according to an embodiment of the invention thus serves as a selector of read or write memory cell 904.

In an embodiment, memory cell 904 is preferably a resistive type non-volatile, rewritable memory cell such as an OxRAM, CBRAM, MRAM, PCRAM FeRAM or STTRAM memory. It will be noted that device 905 according to an embodiment the invention and the memory cell may be reversed since they are in series (that is to say device 905 may be connected before or after memory cell 904).

Figures 15, 16:
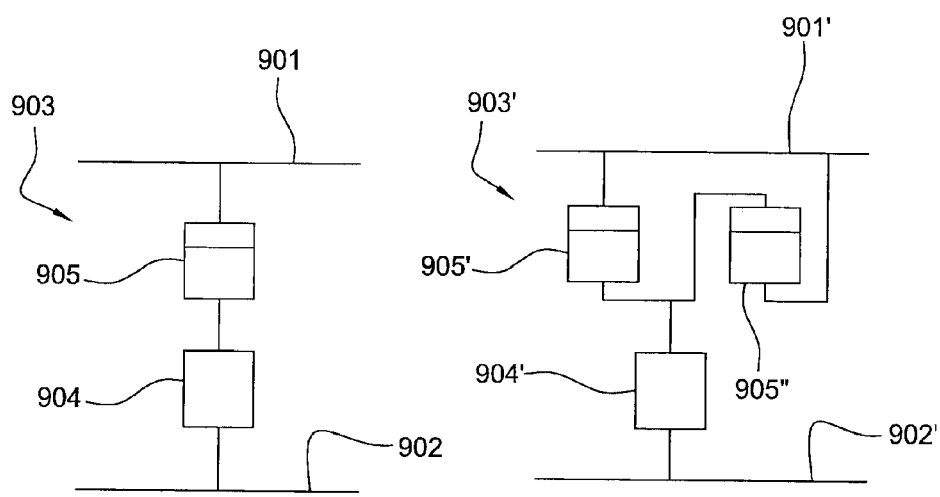
FIG. 15 is a schematic representation of an elementary cell comprising a device according to an embodiment of the invention.
FIG. 16 is a schematic representation of an elementary cell comprising two devices according to an embodiment of the invention.

FIG. 16 is a schematic representation of an second embodiment of an elementary cell 903' that is suitable for use in a matrix 900 such as the one shown in FIG. 14.

Elementary cell 903' enable memory cells 904' to be addressed that require a bipolar function (a first current direction to switch from the OFF state to the ON state and a second current direction, opposite to the first, to switch from the ON state to the OFF state): this is the case for example with CBRAM memory cells that have ionic conduction bridges.

Elementary cell 903' includes two devices 905' and 905" according to an embodiment of the invention, mounted in parallel and head to tail, devices 905' and 905" in parallel being mounted with memory cell 904' between a bitline 901' and a wordline 902'.

It will be appreciated that the device and the method according to an embodiment of the invention are not limited to the embodiments described in the foregoing, which have been presented for purely illustrative and non-limiting purposes with reference to FIGS. 1 to 16.

It will be appreciated that the device according to an embodiment of the invention comprises at least one dendrite, but it may also comprise a plurality of dendrites distributed within the electrolyte.

Moreover, although embodiments of the invention have been described more specifically in the case of the deposition of an electrode or portion of soluble metal that dissolves in the electrolyte, either spontaneously or as the result of stimulation, it is also possible to obtain an electrolyte that contains metal ions produced by copulverisation; typically, this process is started by depositing only the material of the solid electrolyte and a metal that is soluble in the material of the solid electrolyte so as to obtain a portion of electrolyte in which the concentration of metal forming the metal ions is lower than the saturation concentration.

Otherwise, in the case of an elementary cell comprising a resistive memory cell in series with a device according to an embodiment of the invention, first electrode 502 may also be the resistive memory cell itself, assuming that it does not cause an interaction with the selector device according to an embodiment of the invention.

The invention claimed is:

1. An electronic device comprising:
   a first electrode;
   a second electrode;
   a solid electrolyte having a base of an ion conducting material, the first and second electrodes being arranged on opposite sides of the electrolyte, and the first and second electrodes being configured to form at least one metal dendrite between the first electrode and the second electrode from metal ions circulating in the electrolyte when a potential difference equal to or greater than a first positive threshold voltage is applied between this first electrode and the second electrode;
   the device having two resistive states:
      a state of high resistance;
      a state of low resistance;
   wherein a concentration of the metal that forms the metal ions in the electrolyte is chosen so that:
      the device remains in state of high resistance for as long as the first positive threshold voltage between the first electrode and the second electrode is not reached;
      the device switches from the state of high resistance to the state of low resistance when the potential difference between the first electrode and the second electrode is equal to or greater than the first positive threshold voltage;
      the device switches from the state of low resistance to the state of high resistance when the potential difference between the first electrode and the second electrode equal to or greater than the first positive threshold voltage is removed and as it decreases to reach a second positive voltage threshold strictly lower than the first positive threshold voltage.

2. The electronic device as recited in claim 1, wherein the concentration of metal forming the metal ions in the electrolyte is less than a saturation concentration of said metal in the material that constitutes the electrolyte.

3. The electronic device as recited in claim 1, comprising a portion of ionisable metal interposed between the first electrode and the electrolyte.

4. The electronic device as recited in claim 1, wherein the metal ions circulating in the electrolyte are $Ag^{2+}$, $Zn^{2+}$ or $Cu^{2+}$ ions.

5. The electronic device as recited in claim 1, wherein the solid electrolyte is produced from a chalcogenide material such as a selenide or a telluride, certain oxides such as $SiO_2$, $HfO_2$, $Ta_2O_5$, $TiO_2$, GdOx, CuOx, WOx, or sulphides such as $GeS_x$, $Cu_xS$ or AgS.

6. An elementary cell, comprising an electronic device as recited in claim 1, mounted in series with a memory cell that is configured to assume at least two states of resistivity corresponding to two memory states.

7. The elementary cell as recited in claim 6, wherein the memory cell is a rewritable, non-volatile memory cell selected from the group consisting of an OxRAM, CBRAM, MRAM, PCRAM, FeRAM and STTRAM memory.

8. The elementary cell as recited in claim 6, comprising two of said electronic devices mounted in parallel head to tail, the assembly of these two parallel devices being mounted in series with the memory cell.

9. An addressing matrix for a plurality of elementary cells, comprising:
   a plurality of elementary cells according to claim 6;
   two levels of command lines:
      a first level including a plurality of bitlines parallel with each other;
      a second level including a plurality of wordlines parallel with each other;
   each of these cells being arranged at the intersection between a wordline and a bitline.

* * * * *